United States Patent
Lee et al.

(10) Patent No.: US 9,252,284 B2
(45) Date of Patent: Feb. 2, 2016

(54) DISPLAY SUBSTRATE AND METHOD OF MANUFACTURING A DISPLAY SUBSTRATE

(71) Applicant: Samsung Display Co., Ltd., Yongin (KR)

(72) Inventors: Jong-Chan Lee, Suwon-si (KR); Yoon-Ho Khang, Yongin-si (KR); Su-Hyoung Kang, Bucheon-si (KR); Dong-Jo Kim, Yongin-si (KR); Ji-Seon Lee, Hwaseong-si (KR); Myoung-Geun Cha, Seoul (KR); Deuk-Myung Ji, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/182,989

(22) Filed: Feb. 18, 2014

(65) Prior Publication Data

US 2015/0060843 A1    Mar. 5, 2015

(30) Foreign Application Priority Data

Sep. 2, 2013    (KR) .......................... 10-2013-0105010

(51) Int. Cl.
*H01L 29/786*    (2006.01)
*H01L 29/66*    (2006.01)

(52) U.S. Cl.
CPC ...... *H01L 29/7869* (2013.01); *H01L 29/66969* (2013.01); *H01L 29/78606* (2013.01); *H01L 29/78618* (2013.01); *H01L 29/78693* (2013.01)

(58) Field of Classification Search
CPC ..................... H01L 29/7869; H01L 29/66969; H01L 29/78606; H01L 29/78618; H01L 29/78693
See application file for complete search history.

(56) References Cited

U.S. PATENT DOCUMENTS

| | | | |
|---|---|---|---|
| 8,183,099 B2 | 5/2012 | Sakata | |
| 8,378,351 B2 | 2/2013 | Fukumoto et al. | |
| 2008/0290393 A1* | 11/2008 | Kakehata et al. | ............. 257/316 |
| 2010/0193782 A1* | 8/2010 | Sakata | ............. 257/43 |
| 2010/0279474 A1* | 11/2010 | Akimoto et al. | ............. 438/158 |
| 2011/0031491 A1* | 2/2011 | Yamazaki | ......... G02F 1/136227 257/43 |
| 2012/0146017 A1 | 6/2012 | Kim et al. | |
| 2012/0178224 A1 | 7/2012 | Yamazaki | |
| 2013/0048996 A1 | 2/2013 | Noda et al. | |

FOREIGN PATENT DOCUMENTS

| | | |
|---|---|---|
| JP | 2011-091110 | 5/2011 |
| KR | 10-2004-0022289 | 3/2004 |

(Continued)

*Primary Examiner* — Whitney T Moore
(74) *Attorney, Agent, or Firm* — H.C. Park & Associates, PLC

(57) ABSTRACT

A display substrate and a method for manufacturing a display substrate are disclosed. In the method, a gate electrode is formed on a base substrate. An active pattern is formed using an oxide semiconductor. The active pattern partially overlaps the gate electrode. A first insulation layer pattern and a second insulation layer pattern are sequentially formed on the active pattern. The first insulation layer pattern and the second insulation layer pattern overlap the gate electrode. A third insulation layer is formed to cover the active pattern, the first insulation layer pattern and the second insulation layer pattern. Either the first insulation layer pattern or the second insulation layer pattern includes aluminum oxide. Forming the first insulation layer pattern and the second insulation layer pattern includes performing a backside exposure process using the gate electrode as an exposure mask.

6 Claims, 7 Drawing Sheets

(56) References Cited

FOREIGN PATENT DOCUMENTS

| KR | 10-0580396 | 5/2006 |
| KR | 10-0720083 | 11/2008 |
| KR | 10-2010-0035888 | 4/2010 |
| KR | 10-1200237 | 11/2012 |
| KR | 10-2013-0036681 | 4/2013 |

* cited by examiner

DISPLAY SUBSTRATE AND METHOD OF MANUFACTURING A DISPLAY SUBSTRATE

CROSS-REFERENCE TO RELATED APPLICATION

This application claims priority from and the benefit of Korean Patent Application No. 10-2013-0105010, filed on Sep. 2, 2013, which is hereby incorporated by reference for all purposes as if fully set forth herein.

BACKGROUND

1. Field

Exemplary embodiments of the present invention relate to a display substrate including a self-aligned channel region and a method of manufacturing the display substrate.

2. Discussion of the Background

Generally, a thin film transistor for driving a pixel in a display device includes a gate electrode, a source electrode, a drain electrode, and an active pattern forming a channel between the source electrode and the drain electrode. The active pattern typically includes a semiconductor layer including at least one of amorphous silicon, polycrystalline silicon, oxide semiconductor, or various other materials recognizable by one having skill in the art.

Amorphous silicon has a relatively low electron mobility, which may be in a range from about 1 square centimeter per volt second ($cm^2/V \cdot s$) to about 10 $cm^2/V \cdot s$, so that a thin film transistor including amorphous silicon has relatively low driving characteristics. Polycrystalline silicon has a relatively high electron mobility, which may be in a range from about 10 $cm^2/V$ to about hundreds $cm^2/V$. However, a crystallization process is generally used for forming polycrystalline silicon. Thus, forming a uniform polycrystalline silicon layer on a large-sized substrate may be difficult, and the resulting manufacturing costs may be high. In contrast, oxide semiconductors may be formed through a low-temperature process, may be easily formed in a large-scale, and have a high electron mobility. Thus, research is actively being conducted on thin film transistors that include an oxide semiconductor.

As a length of a channel region decreases, operation speed and power consumption of the thin film transistor are improved. However, a process margins may be degraded and reliability may decrease due to increased misalignments.

SUMMARY

Exemplary embodiments of the present invention provide a display substrate having improved reliability.

Exemplary embodiments of present invention also provide a method of manufacturing a display substrate including a self-aligned channel region.

Additional features of the invention will be set forth in the description which follows, and in part will be apparent from the description, or may be learned by practice of the invention.

An exemplary embodiment of the present invention discloses a method for manufacturing a thin film transistor. In the method, a gate electrode is disposed on a base substrate. An active pattern is formed using an oxide semiconductor. The active pattern partially overlaps the gate electrode. A first insulation layer pattern and a second insulation layer pattern are formed sequentially on the active pattern. The first insulation layer pattern and the second insulation layer pattern overlap the gate electrode. A third insulation layer is formed to cover the active pattern, the first insulation layer pattern and the second insulation layer pattern. Either the first insulation layer pattern or the second insulation layer pattern includes aluminum oxide. Forming the first insulation layer pattern and the second insulation layer pattern includes performing a backside exposure process using the gate electrode as an exposure mask.

An exemplary embodiment of the present invention also discloses a display substrate including a gate electrode, an active pattern, a first insulation layer pattern, a second insulation layer pattern and a third insulation layer. The gate electrode is disposed on the base substrate. The active pattern includes an oxide semiconductor. The active pattern partially overlaps the gate electrode and includes a first region, a second region and a third region. The first insulation layer pattern and the second insulation layer pattern are disposed on the first region of the active pattern. The first insulation layer pattern and the second insulation layer pattern overlap the gate electrode. The third insulation layer covers the active pattern, the first insulation layer pattern and the second insulation layer pattern. Either the first insulation layer pattern or the second insulation layer pattern includes aluminum oxide. Each of the first insulation layer pattern and the second insulation layer pattern has a width substantially the same as a width of the gate electrode.

BRIEF DESCRIPTION OF THE DRAWINGS

The above and other features and advantages will become more apparent by describing example embodiments thereof with reference to the accompanying drawings.

DETAILED DESCRIPTION OF THE ILLUSTRATED EMBODIMENTS

Figure 1:
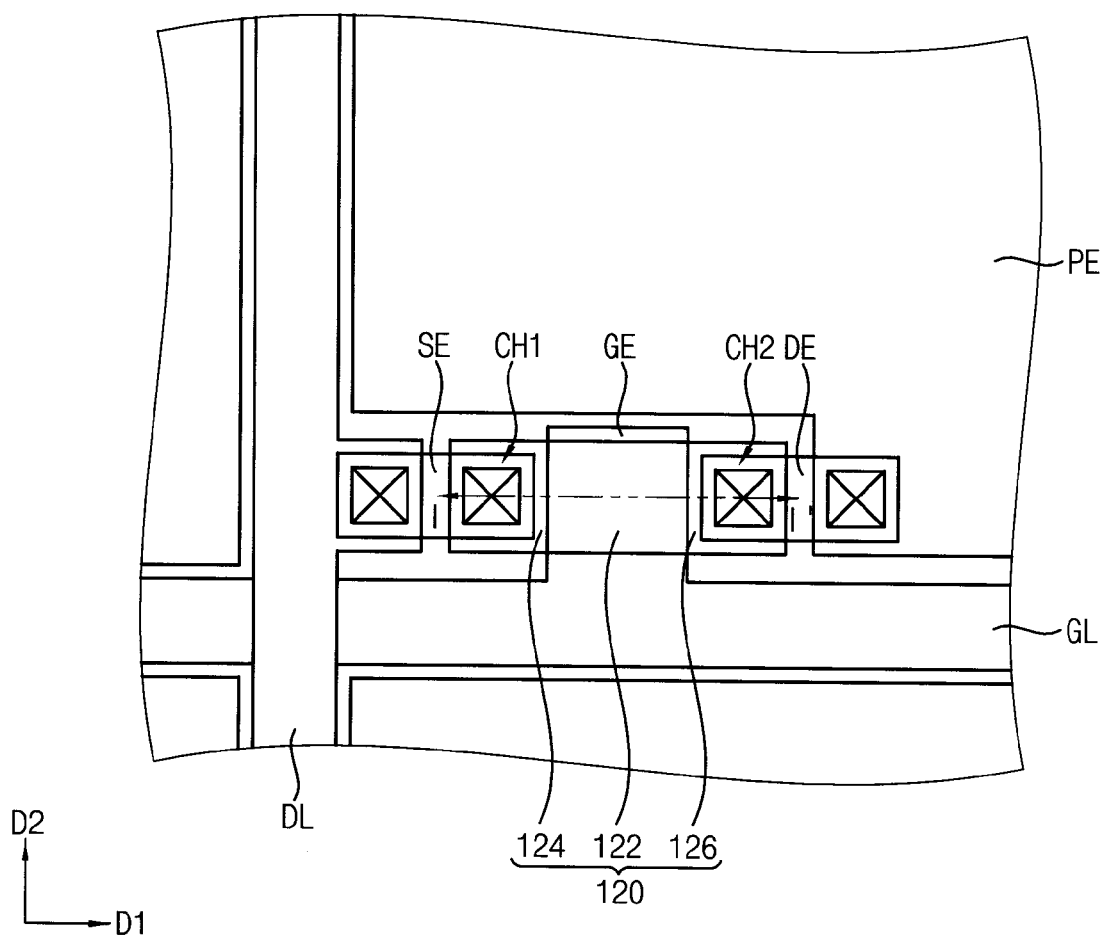
FIG. 1 is a plan view illustrating a display substrate according to according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
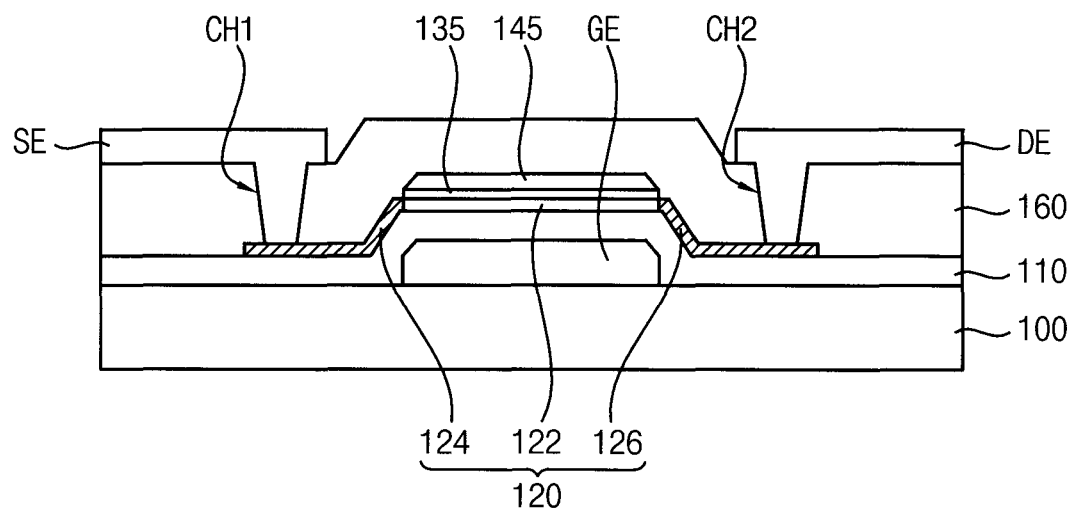
FIG. 2 is a cross-sectional view taken along line I-I' of FIG. 1.

FIG. 1 is a plan view illustrating a display substrate according to a first exemplary embodiment of the present invention, and FIG. 2 is a cross-sectional view taken along line I-I' of FIG. 1.

Referring to FIGS. 1 and 2, the display substrate includes a base substrate 100, a gate line GL, a data line DL, a thin film transistor, a pixel electrode PE, a first insulation layer pattern 135, a second insulation layer pattern 145, and a third insulation layer 160. Further, the thin film transistor includes a gate electrode GE, a gate insulation layer 110, an active pattern 120, a source electrode SE, and a drain electrode DE.

The gate line GL may be disposed on the base substrate 100 and may extend in a first direction D1. The data line DL may extend in a second direction D2. The first direction D1 may cross the second direction D2. More specifically, the first direction D1 may be substantially perpendicular to the second direction D2.

The thin film transistor may be disposed at an intersection of the gate line GL and the data line DL. The thin film transistor may be electrically connected to the data line DL by the source electrode SE, and may be electrically connected to the pixel electrode PE by the drain electrode DE. Further, the thin film transistor may be electrically connected to the gate line GL by the gate electrode GE.

The gate electrode GE may be disposed on the base substrate 100. For example, the gate electrode GE may protrude from the gate line GL in the second direction D2.

The gate insulation layer 110 is disposed on the base substrate 100 to cover the gate line GL and the gate electrode GE. For example, the gate insulation layer 110 may include an insulation material such as silicon oxide, silicon nitride or silicon oxy-nitride. For example, the gate insulation layer 110 may have a thickness of about 1000 Å to about 3000 Å.

The active pattern 120 may overlap with the gate electrode GE. The active pattern 120 may include a metal oxide semiconductor. That is, the active pattern 120 may include oxide semiconductor. For example, the active pattern 120 may include at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

The active pattern 120 may be divided into a first region 122, a second region 124 and a third region 126 depending on an impurity concentration.

The first region 122 is disposed at the middle of the active pattern 120 and overlaps the gate electrode GE. Particularly, the first region 122 may entirely overlap the gate electrode GE, and may have a shape that corresponds to the gate electrode GE. The first region 122 may have a relatively small impurity concentration (e.g., hydrogen, fluorine) or may not include impurities. The first region 122 may have an electrical conductivity that corresponds to a semiconductor. The first region 122 may serve as a channel region of the thin film transistor.

In an exemplary embodiment, the first region 122 may have a width of about 2.5 μm to about 5 μm in the first direction D1. That is, the thin film transistor may have a relatively short channel length, so that the operation speed of the thin film transistor increases.

The second region 124 and the third region 126 may be disposed adjacent to the first region 122. The second region 124 and the third region 126 may be spaced apart from each other in the first direction D1. That is, the first region 122 may be disposed between the second region 124 and the third region 126. Further, the second region 124 and the third region 126 may be disposed not to overlap the gate electrode GE.

Each of the second region 124 and the third region 126 has an impurity concentration (e.g., hydrogen, fluorine) that is substantially larger than the impurity concentration of the first region 122. Further, each of the second region 124 and the third region 126 has an electrical conductivity that is substantially larger than the electrical conductivity of the first region 122. In an exemplary embodiment, the second region 124 may serve as a source region of the thin film transistor, and the third region 126 may serve as a drain region of the thin film transistor.

Accordingly, the source region (that is, the second region 124) and the drain region (that is, the third region 126) of the active pattern 120 may be self-aligned not to overlap the gate electrode GE. Therefore, a parasitic capacitance between the gate electrode GE and the source region or the drain region may be reduced.

Further, the thin film transistor may have an improved reliability, even though the first region 122 may have a relatively small width. The first region 122, the second region 124 and the third region 126 may be self-aligned, so that a misalignment between the gate electrode and the active pattern 120 may be prevented.

The first insulation layer pattern 135 and the second insulation layer pattern 145 are sequentially stacked on the first region 122 of the active pattern 120. The first insulation layer pattern 135 and the second insulation layer pattern 145 may entirely overlap the gate electrode GE and the first region 122. That is, each of the first insulation layer pattern 135 and the second insulation layer pattern 145 may have a shape that corresponds to the shape of the gate electrode GE.

The first insulation layer pattern 135 and the second insulation layer pattern 145 may include at least one of aluminum oxide, silicon oxide, silicon nitride, and silicon oxy-nitride. Particularly, either the first insulation layer pattern 135 or the second insulation layer pattern 145 may include aluminum oxide.

In an exemplary embodiment, the first insulation layer pattern 135 may include aluminum oxide, and the second insulation layer pattern 145 may include silicon oxide. The first insulation layer pattern 135 and the second insulation layer pattern 145 may prevent or reduce diffusion or a doping of the impurities into the first region 122 of the active pattern 120. That is, the first insulation layer pattern 135 and the second insulation layer pattern 145 may constitute a multi-layered structure that may include the aluminum oxide layer. In this manner, the multi-layered structure may effectively block impurities compared to a single-layered structure or a multi-layered structure that does not include the aluminum oxide layer. The effect of the first insulation layer pattern 135 and the second insulation layer pattern 145 will be described with reference to table 1.

Further, the first insulation layer pattern 135 and the second insulation layer pattern 145 may serve as an etch stopper during a manufacturing process.

In exemplary embodiments, the first insulation layer pattern 135 may have a thickness in a range of about 50 Å to about 4000 Å. If the first insulation layer pattern 135 has a thickness below about 50 Å, the first insulation layer pattern 135 and the second insulation layer pattern 145 may not effectively block the impurities. If the first insulation layer pattern 135 has a thickness above about 4000 Å, the process time for forming the first insulation layer may increase. Further, the second insulation layer pattern 145 may have a thickness in a range of about 50 Å to about 4000 Å.

TABLE 1

| | Oxide semiconductor layer/AlOx layer/SiNx layer | | | Oxide semiconductor layer/AlOx layer/SiOx layer/SiNx layer | | |
|---|---|---|---|---|---|---|
| | Thickness | | | | | |
| | 50 Å | 100 Å | 200 Å | 50 Å | 100 Å | 200 Å |
| Hydrogen concentration in the oxide semiconductor layer | 0.72% | 0.56% | 0.35% | 0.83% | 0.54% | 0.36% |
| Hydrogen concentration at an interface of the oxide semiconductor layer and the aluminum oxide layer | 1.42% | 1.17% | 0.76% | 1.33% | 0.88% | 0.67% |
| Hydrogen concentration in the aluminum oxide layer | 4.14% | 3.93% | 3.30% | 3.24% | 3.37% | 3.93% |

Table 1 shows the impurity block effect of insulation layer patterns according to exemplary embodiments of the invention. In the experiment, the oxide semiconductor layer was formed using indium zinc tin oxide (IZTO), and the aluminum oxide (AlOx) layer was formed to have different thicknesses. Then, the silicon nitride (SiNx) layer and/or the silicon oxide layer (SiOx) layer were formed on the AlOx layer. The hydrogen concentration was measured in the oxide semiconductor layer and the AlOx layer, and at the interface of the oxide semiconductor layer and the aluminum oxide layer.

When the aluminum oxide layer has a thickness of about 50 Å, about 100 Å or about 200 Å, the insulation layer patterns have improved hydrogen blocking effect. Further, AlOx/SiNx structure has higher hydrogen blocking effect than that of AlOx/SiOx/SiNx structure.

The third insulation layer 160 may be disposed to cover the active pattern 120, the first insulation layer pattern 135 and the second insulation layer pattern 145. Particularly, the third insulation layer 160 may directly contact the second region 124 and the third region 126 of the active pattern 120.

The third insulation layer 160 may include at least one of silicon nitride or silicon oxy-nitride. The third insulation layer 160 may have a single-layered structure or a multi-layered structure. In exemplary embodiments, the third insulation layer 160 may have a thickness in a range of about 1000 Å to about 4000 Å. The third insulation layer 160 may serve as a passivation layer for protecting the active pattern 120.

In an exemplary embodiment, the third insulation layer 160 may include silicon nitride. During the process for forming the third insulation layer 160, impurities such as hydrogen may be included in the third insulation layer 160. Further, the impurities such as hydrogen may be diffused into the second region 124 and the third region 126 of the active pattern 120.

The source electrode SE may be electrically connected to the second region 124 of the active pattern 120 through a first contact hole CH1 penetrating the third insulation layer 160. The drain electrode DE may be electrically connected to the third region 126 of the active pattern 120 through a second contact hole CH2 penetrating the third insulation layer 160.

In exemplary embodiments, each of the source electrode SE and the drain electrode DE may include a conductive oxide such as at least one of indium zinc oxide (IZO), indium tin oxide (ITO), tin oxide (SnOx), and zinc oxide (ZnOx), or at least one metal such as copper, silver, chromium, molybdenum, aluminum, titanium, and manganese.

The source electrode SE and the drain electrode DE may be electrically connected to the data line DL and the pixel electrode PE through contacts as illustrated in FIG. 1. In another exemplary embodiment, the source electrode SE and the data line DL may be integrally formed, and the drain electrode DE and the pixel electrode PE may be integrally formed.

According to exemplary embodiments, either the first insulation layer pattern 135 or the second insulation layer pattern 145 may include aluminum oxide. Further, the first insulation layer pattern 135 and the second insulation layer pattern 145 may be formed by performing a backside exposure using the gate electrode GE as an exposure mask. Therefore, the first insulation layer pattern 135 and the second insulation layer pattern 145 may be patterned without using an additional exposure mask, and the first insulation layer pattern 135 and the second insulation layer pattern 145 may be self-aligned to overlap the gate electrode GE. Further, when the third insulation layer 160 is formed, impurities such as hydrogen may be diffused into portions of the active pattern 120, thereby forming the second region 124 and the third region 126. In this case, the first insulation layer pattern 135 and the second insulation layer pattern 145 may effectively block the impurities, so that the second region 124 and the third region 126 may be self-aligned not to overlap the gate electrode GE.

FIGS. 3 to 9 are cross-sectional views illustrating a method of manufacturing the display substrate illustrated in FIGS. 1 and 2.

Figure 3:
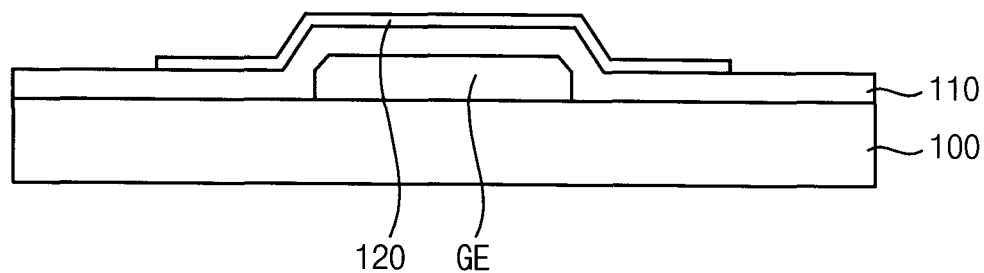
FIGS. 3 to 9 are cross-sectional views illustrating a method of manufacturing the display substrate illustrated in FIGS. 1 and 2.

Referring to FIG. 3, a gate electrode GE, a gate insulation layer 110 and an active pattern 120 are formed on a base substrate 100.

Particularly, a gate metal layer is formed on the base substrate 100, and the gate metal layer is patterned to form a gate line and the gate electrode GE. Then, the gate insulation layer 110 and the oxide semiconductor layer are formed to cover the gate electrode GE and the gate line, and the oxide semiconductor layer is patterned to form the active pattern 120.

The base substrate 100 may include transparent insulation material. Examples of transparent insulation material may include a glass substrate, a quartz substrate, a silicon substrate, and a plastic substrate. Therefore, the base substrate 100 may have a relatively high light transmittance.

Examples of a material that may be used for the gate metal layer may include at least one of copper, silver, chromium, molybdenum, aluminum, titanium, manganese, alloys thereof, and various other metals having like properties. The gate metal layer may have a single-layered structure, or a multi-layered structure including a plurality of metal layers including different metals. In an exemplary embodiment, the gate metal layer may have a multi-layered structure including copper and copper nitride. The gate metal layer may have a relative low light transmittance.

Further, the gate insulation layer 110 may be formed by a chemical vapor deposition (CVD) process or an atomic layer deposition (ALD) process. For example, the gate insulation layer 110 may include at least one of silicon oxide, silicon nitride, and silicon oxy nitride.

The oxide semiconductor layer may be formed by a physical vapor deposition process such as an evaporation process or a sputtering process. The oxide semiconductor layer may be formed using oxide of at least one of indium, zinc, gallium, tin, titanium, phosphor, and hafnium. For example, the oxide semiconductor layer may include at least one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

In an example embodiment, an annealing process may be further performed to heat the oxide semiconductor layer. The annealing process may improve electrical characteristics of the oxide semiconductor layer.

Figure 4:
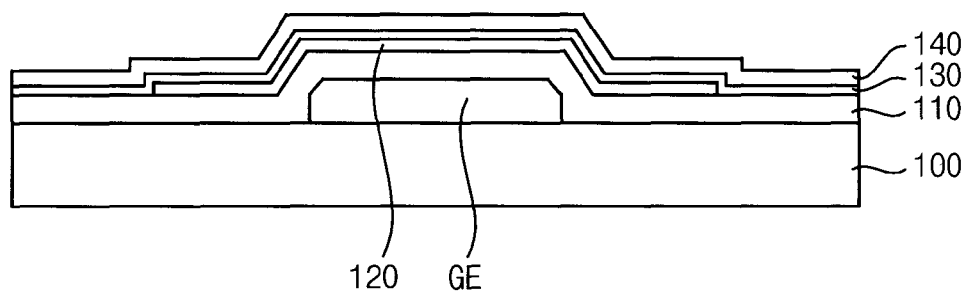

Referring to FIG. 4, a first insulation layer 130 and a second insulation layer 140 may be formed on the gate insulation layer 110 to cover the active pattern 120.

The first insulation layer 130 and the second insulation layer 140 may be sequentially formed by, for example, a CVD process or an ALD process.

The first insulation layer 130 and the second insulation layer 140 may include at least one of aluminum oxide, silicon oxide, silicon nitride, and silicon oxy-nitride. Particularly, either the first insulation layer 130 or the second insulation layer 140 may include aluminum oxide. In an example embodiment, the first insulation layer 130 may include aluminum oxide, and the second insulation layer 140 may include silicon oxide.

For example, various source gases such as TMA(Al(CH$_3$)$_3$), AlCl$_3$, AlH$_3$N(CH$_3$)$_3$, (C$_4$H$_9$)$_2$AlH, (CH$_3$)$_2$AlCl, (C$_2$H$_5$)$_3$Al or (C$_4$H$_9$)$_3$Al may be used to form the first insulation layer 130. Further, the deposition process for forming the first insulation layer 130 may not use plasma, so that impurities may not diffused into the active pattern 120 during the deposition process.

Figure 5:
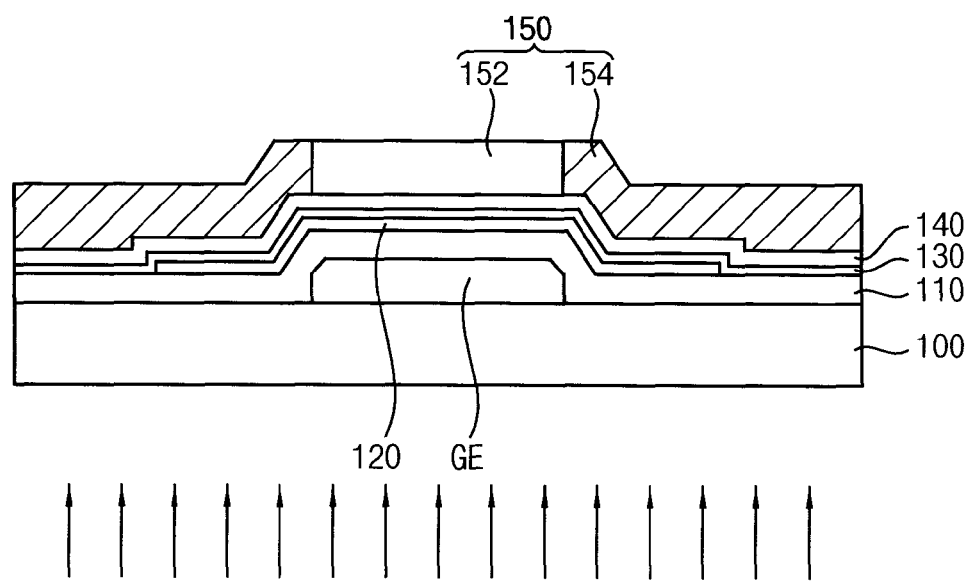

Referring to FIG. 5, a photoresist layer 150 is formed on the second insulation layer 140, and then an exposure process is performed on the photoresist layer 150.

The photoresist layer 150 may be formed using material that may have an etch selectivity with respect to the first insulation layer 130 and the second insulation layer 140.

Further, the photoresist layer 150 may be exposed by a backside exposure process. In this case, the gate electrode GE (and the gate line) having a relatively low light transmittance may serve as an exposure mask. Therefore, a portion (that is, a photoresist pattern 152) of the photoresist layer 150 that overlaps the gate electrode GE may not be exposed to a light source, and exposed portions 154 of the photoresist layer 150 that do not overlap the gate electrode GE may be exposed to the light source.

Then, the exposed portions 154 of the photoresist layer 150 may be selectively removed by a develop process, thereby forming the photoresist pattern 152. The gate electrode GE is used as an exposure mask, so that the photoresist layer 150 may be patterned without using an additional mask. Further, the photoresist pattern 152 may have a shape substantially the same as that of the gate electrode GE.

Figure 6:
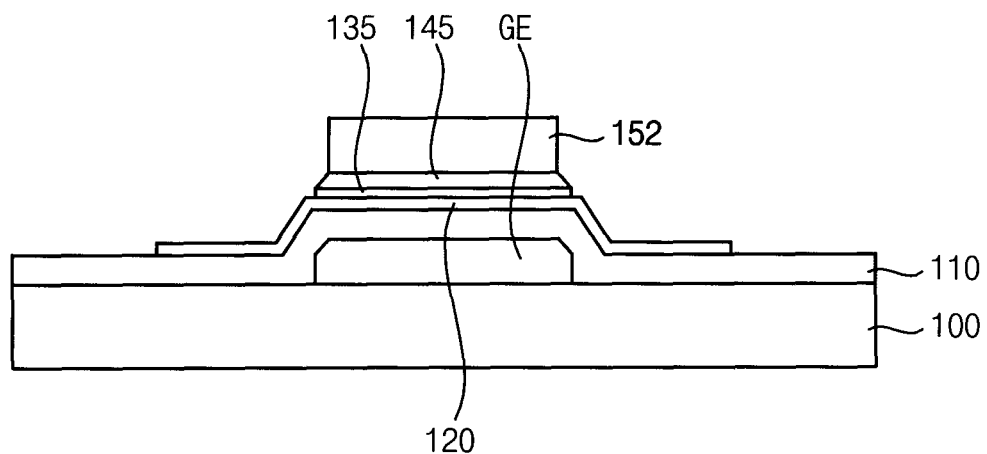

Referring to FIG. 6, the first insulation layer pattern 135 and the second insulation layer pattern 145 may be formed using the photoresist pattern 152.

Particularly, the first insulation layer 130 and the second insulation layer 140 may be selectively etched using the photoresist pattern 152 as an etching mask. Therefore, the first insulation layer pattern 135 and the second insulation layer pattern 145 may overlap the photoresist pattern 152 and the gate electrode GE. That is, each of the first insulation layer pattern 135 and the second insulation layer pattern 145 may have a shape that is substantially the same as that of the gate electrode GE.

Then, a strip process or an ashing process may be performed to remove the photoresist pattern 152.

Figure 7:
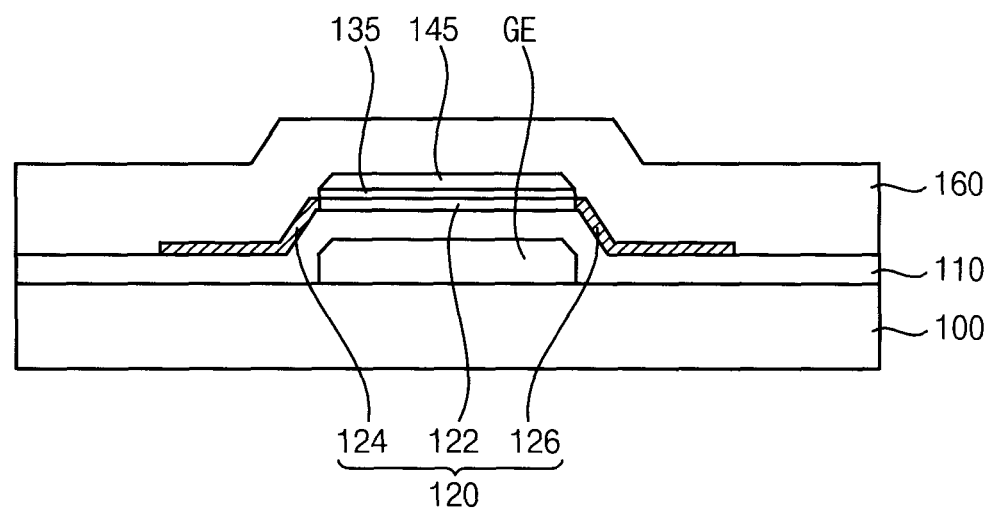
Figure 8:
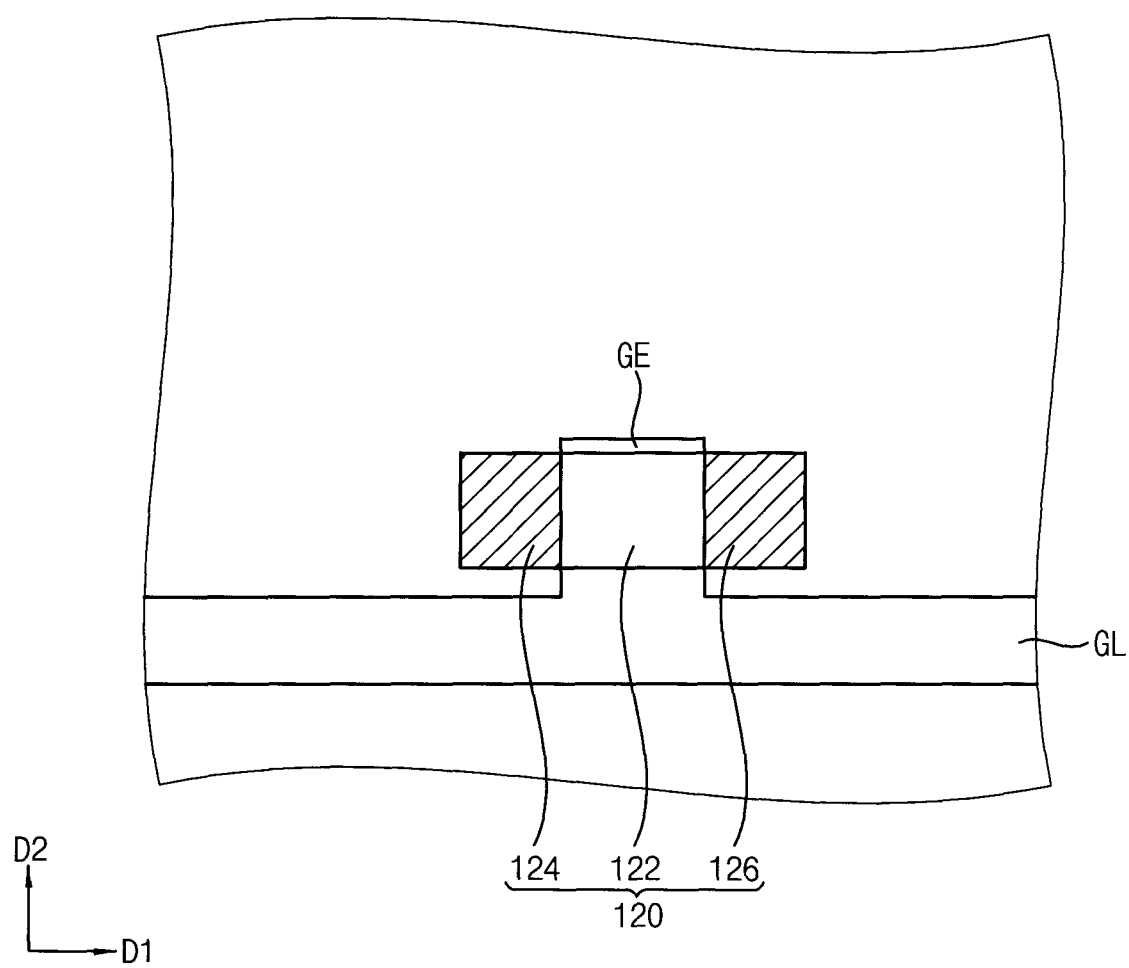

Referring to FIGS. 7 and 8, a third insulation layer 160 may be formed to cover the active pattern 120, the first insulation layer pattern 135 and the second insulation layer pattern 145.

In exemplary embodiments, the third insulation layer 160 may be formed using silicon nitride or silicon oxy nitride by a plasma enhanced CVD process or a plasma enhanced ALD process. For example, the third insulation layer 160 may be formed using a silicon source gas including hydrogen such as SiH$_4$, Si$_2$H$_6$, SiH$_3$Cl, SiCl$_2$H$_2$, SiCl$_3$H, etc.

During the deposition process, the hydrogen included in the silicon source gas or the third insulation layer 160 may be doped into portions of the active pattern 120. Therefore, the active pattern 120 may be divided into a first region 122, a second region 124, and a third region 126.

The first region 122 may be disposed at a middle of the active pattern 120, and may overlap the first insulation layer pattern 135 and the second insulation layer pattern 145. The first insulation layer pattern 135 and the second insulation layer pattern 145 may prevent or reduce diffusion or a doping of the impurities into the first region 122. The first region 122 may have a relatively small impurity concentration (e.g., hydrogen or fluorine) or may not include impurities. The first region 122 may have an electrical conductivity that corresponds to a semiconductor. In an exemplary embodiment, the first region 122 may serve as a channel region of the thin film transistor.

The second region 124 and the third region 126 may be disposed adjacent to the first region 122. The second region 124 and the third region 126 may be spaced apart from each other in the first direction D1. The second region 124 and the third region 126 may be disposed not to overlap the first insulation layer pattern 135 and the second insulation layer pattern 145. That is, the second region 124 and the third region 126 may not be covered by the first insulation layer pattern 135 and the second insulation layer pattern 145, so that impurities such as hydrogen may be doped into the second region 124 and the third region 126. Therefore, each of the second region 124 and the third region 126 has an electrical conductivity that is substantially larger than the electrical conductivity of the first region 122. In an exemplary embodiment, the second region 124 may serve as a source region of the thin film transistor, and the third region 126 may serve as a drain region of the thin film transistor.

The first insulation layer pattern 135 and the second insulation layer pattern 145 may serve as an ion implantation mask, so that the second region 124 and the third region 126 may be self-aligned as to not overlap the first insulation layer pattern 135 and the second insulation layer pattern 145.

Further, each of the first insulation layer pattern 135 and the second insulation layer pattern 145 may have the shape substantially the same as that of the gate electrode GE, so that the second region 124 and the third region 126 may be self-aligned not to overlap the gate electrode GE. Therefore, a parasitic capacitance between the gate electrode GE and the source region or the drain region may be reduced.

Further, the thin film transistor may have an improved reliability, even though the first region 122 may have a relatively small width. The first region 122, the second region 124 and the third region 126 may be self-aligned, so that misalignments between the gate electrode and the active pattern 120 may be prevented.

Figure 9:
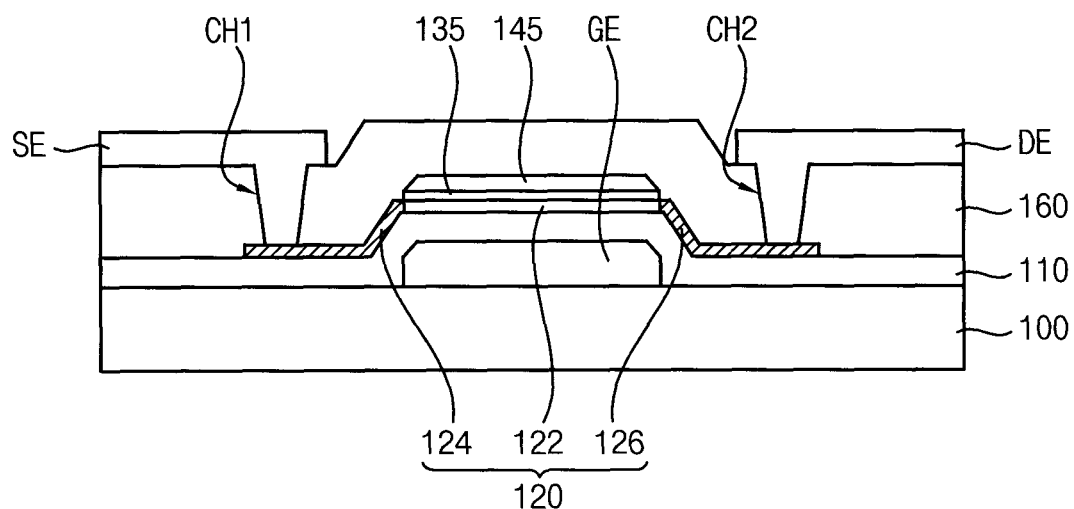

Referring to FIG. 9, a source electrode SE and a drain electrode DE may be formed on the third insulation layer 160.

Particularly, the third insulation layer 160 is partially removed to form contact holes CH1 and CH2 exposing the active pattern, an electrode layer is formed to fill the contact holes CH1 and CH2, and then the electrode layer is patterned to form the source electrode SE and the drain electrode DE.

For example, the first contact hole CH1 may expose the second region 124 of the active pattern 120, and the second contact hole CH2 may expose the third region 126 of the active pattern 120. Even though the locations of the contact holes CH1 and CH2 may change due to a misalignment, the first insulation layer pattern 135 and the second insulation layer pattern 145 may serve as an etch stopper. Therefore, the first region 122 of the active pattern 120 may not be damaged or exposed by an etching process for forming the contact holes CH1 and CH2.

The electrode layer may be formed using a conductive oxide such as at least one of indium zinc oxide (IZO), indium tin oxide (ITO), tin oxide (SnOx), and zinc oxide (ZnOx) or at least one metal such as copper, silver, chromium, molybdenum, aluminum, titanium, and manganese.

Figure 10:
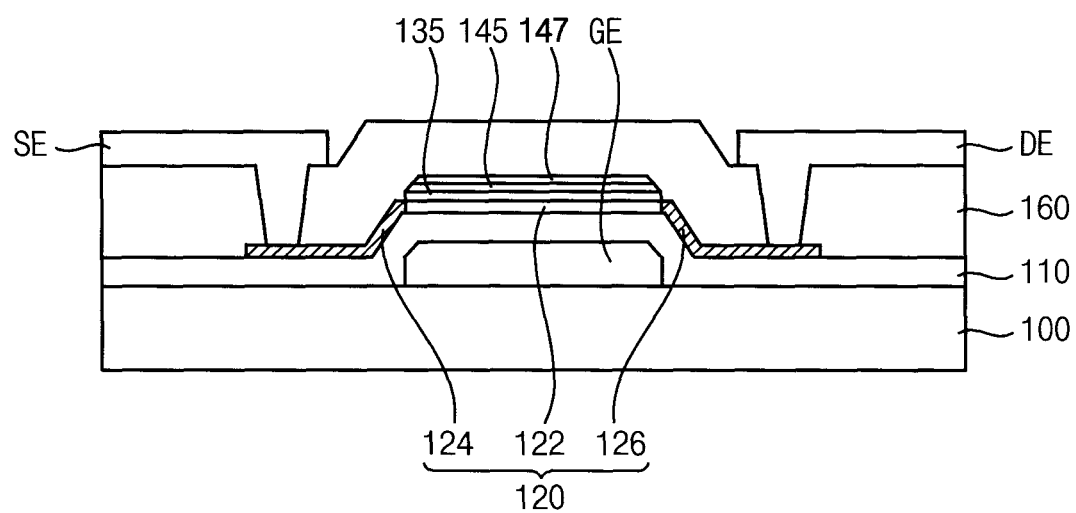
FIG. 10 is a cross-sectional view illustrating a display substrate according to a second exemplary embodiment of the present invention.

FIG. 10 is a cross-sectional view illustrating a display substrate according to another example embodiment of the invention. The display substrate of FIG. 10 may be substantially similar to those illustrated in FIGS. 1 and 2 except for a fourth insulation layer pattern 147.

Referring to FIG. 10, the display substrate according to an example embodiment of the invention may include a base substrate 100, a gate line GL, a data line DL, a thin film transistor, a pixel electrode PE, a first insulation layer pattern 135, a second insulation layer pattern 145, a third insulation layer 160, a fourth insulation layer pattern 147. Further, the thin film transistor may include a gate electrode GE, a gate insulation layer 110, an active pattern 120, a source electrode SE and a drain electrode DE.

The gate insulation layer 110 may be formed on the base substrate 100 to cover the gate electrode, and the active pattern 120 may be formed on the gate insulation layer 110 and may overlap the gate electrode GE. The active pattern 120 is divided into a first region 122, a second region 124 and a third region 126 depending on an impurity concentration. The second region 124 and the third region 126 may be disposed so as not to overlap the gate electrode GE, and each of the second region 124 and the third region 126 may have an impurity concentration (e.g., hydrogen, fluorine) that is substantially larger than that of the first region 122.

The first insulation layer pattern 135, the second insulation layer pattern 145 and the fourth insulation layer pattern 147 may be sequentially disposed on the first region 122 of the active pattern 120.

The first insulation layer pattern 135, the second insulation layer pattern 145 and the fourth insulation layer pattern 147 may include at least one of aluminum oxide, silicon oxide, silicon nitride, and silicon oxy-nitride. Particularly, one of the first insulation layer pattern 135, the second insulation layer pattern 145 and the fourth insulation layer pattern 147 may include aluminum oxide.

In exemplary embodiments, the first insulation layer pattern 135 may include aluminum oxide, the second insulation layer pattern 145 may include silicon oxide, and the fourth insulation layer pattern 147 may include silicon nitride.

The first insulation layer pattern 135, the second insulation layer pattern 145 and the fourth insulation layer pattern 147 may effectively block a diffusion of impurities into the first region 122. Further, the first insulation layer pattern 135, the second insulation layer pattern 145 and the fourth insulation layer pattern 147 may serve as an etch stopper during a manufacturing process.

The third insulation layer 160 is disposed to cover the active pattern 120, the first insulation layer pattern 135, the second insulation layer pattern 145 and the fourth insulation layer pattern 147. The third insulation layer 160 may serve as a passivation layer for protecting the active pattern 120.

The source electrode SE and the drain electrode DE may be electrically connected to the second region 124 and the third region 126 of the active pattern 120 through the contact holes CH1 and CH2.

Figure 11:
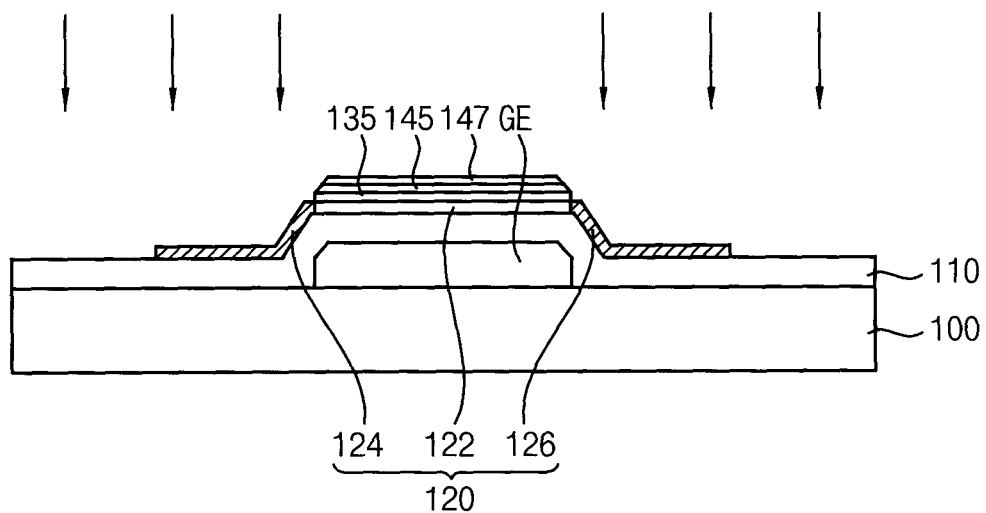
FIGS. 11 and 12 are cross-sectional views illustrating a method of manufacturing the display substrate of FIG. 10.
Figure 12:
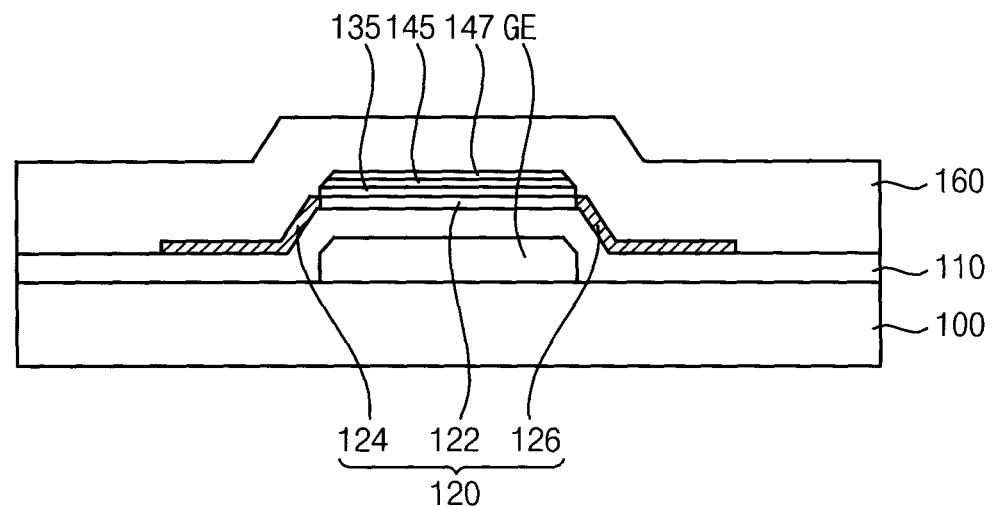

FIGS. 11 and 12 are cross-sectional views illustrating a method of manufacturing the display substrate according to an exemplary embodiment of the invention. The method of FIGS. 11 and 12 may be substantially similar to those illustrated in FIGS. 3 to 10. Thus, like reference numerals refer to like elements, and repetitive explanations thereon may be omitted herein.

Firstly, processes substantially the same as or similar to those illustrated with reference to FIGS. 3 to 6 may be performed. That is, a gate electrode GE, a gate insulation layer 110 and an active pattern 120 may be formed on a base substrate 100. Then, a first insulation layer, a second insulation layer and a fourth insulation layer may be sequentially formed to cover the active pattern 120, and the first insulation layer, the second insulation layer and the fourth insulation layer may be patterned by using the gate electrode GE as an exposure mask, thereby forming a first insulation layer pattern 135, a second insulation layer pattern 145, and a fourth insulation layer pattern 147.

Referring to FIG. 11, impurities are partially doped into the active pattern 120.

Particularly, a gas including the impurity atom (e.g., hydrogen or fluorine) may be introduced in a process chamber, and a plasma may be generated to implant impurities into the active pattern 120. For example, the gas may include hydrogen gas ($H_2$).

Therefore, the active pattern 120 may be divided into a first region 122, a second region 124 and a third region 126. The first region 122 which may overlap the first insulation layer pattern 135, the second insulation layer pattern 145 and the fourth insulation layer pattern 147 may have a relatively small impurity concentration. Each of the second region 124 and the third region 126 has an electrical conductivity that may be substantially larger than the electrical conductivity of the first region 122.

Referring to FIG. 12, a third insulation layer 160 is formed to cover the active pattern 120, the first insulation layer pattern 135, the second insulation layer pattern 145, and the fourth insulation layer pattern 147.

A process for forming the third insulation layer 160 may be substantially similar to those illustrated in FIGS. 7 and 8. However, the process for forming the third insulation layer 160 may not use plasma. That is, the third insulation layer 160 may be formed, for example, by a CVD process or an ALD process instead of a PECVD process or a PEALD process.

During the process for forming the third insulation layer 160, the first insulation layer pattern 135, the second insulation layer pattern 145 and the fourth insulation layer pattern 147 may effectively block a diffusion of impurities into the first region 122.

Then, a source electrode SE and a drain electrode DE may be formed through the third insulation layer 160.

Embodiments of the invention may be used for a display device such as a liquid crystal display device or an OLED.

The foregoing is illustrative of the present teachings and is not to be construed as limiting thereof. Although a few example embodiments have been described, those skilled in the art will readily appreciate from the foregoing that many modifications are possible in the example embodiments without materially departing from the novel teachings and advantages of the present disclosure of invention. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A display substrate, comprising:
    a substrate;
    a gate electrode disposed on the substrate;
    an active pattern comprising an oxide semiconductor, the active pattern comprising a first region, a second region, and a third region, the first region of the active pattern overlapping the gate electrode and having an electrical conductivity smaller than those of the second region and the third region;
    a first insulation layer pattern and a second insulation layer pattern disposed on the first region of the active pattern, the first insulation layer pattern and the second insulation layer pattern overlapping the gate electrode; and
    a third insulation layer covering the active pattern, the first insulation layer pattern, and the second insulation layer pattern, contacting the second region and the third region and being separated from the first region, and the third insulation layer comprising at least one of silicon nitride and silicon oxy-nitride,
    wherein either the first insulation layer pattern or the second insulation layer pattern comprises aluminum oxide, and
    wherein each of the first insulation layer pattern and the second insulation layer pattern has a width substantially the same as a width of the gate electrode.

2. The display substrate of claim 1, wherein the first region of the active pattern has a width substantially the same as the width of the first insulation layer pattern.

3. The display substrate of claim 1, wherein the second region and the third region of the active pattern are self-aligned to not overlap the gate electrode.

4. The display substrate of claim 1, wherein the first insulation layer pattern and the second insulation layer pattern reduce a diffusion or a doping of the impurities from the third insulation layer into the first region of the active pattern.

5. The display substrate of claim 1, further comprising a fourth insulation layer pattern disposed on the second insulation layer pattern.

6. The display substrate of claim 1, further comprising a gate insulation layer disposed between the gate electrode and the active pattern.
    wherein the active pattern comprises at least one of amorphous zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO).

* * * * *